(12) United States Patent
Gross et al.

(10) Patent No.: US 11,932,577 B2
(45) Date of Patent: *Mar. 19, 2024

(54) ION EXCHANGEABLE GLASS WITH FAST DIFFUSION

(71) Applicant: CORNING INCORPORATED, Corning, NY (US)

(72) Inventors: Timothy Michael Gross, Corning, NY (US); Xiaoju Guo, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 836 days.

This patent is subject to a terminal disclaimer.

(21) Appl. No.: 16/780,369

(22) Filed: Feb. 3, 2020

(65) Prior Publication Data

US 2020/0181000 A1 Jun. 11, 2020

Related U.S. Application Data

(63) Continuation of application No. 15/381,614, filed on Dec. 16, 2016, now Pat. No. 10,550,029.

(60) Provisional application No. 62/268,659, filed on Dec. 17, 2015.

(51) Int. Cl.
| | |
|---|---|
| *C03C 3/097* | (2006.01) |
| *C03C 4/18* | (2006.01) |
| *C03C 21/00* | (2006.01) |
| *H05K 5/00* | (2006.01) |
| *H05K 5/02* | (2006.01) |

(52) U.S. Cl.
CPC ............ *C03C 3/097* (2013.01); *C03C 4/18* (2013.01); *C03C 21/002* (2013.01); *H05K 5/0017* (2013.01); *H05K 5/0217* (2013.01); *C03C 2204/00* (2013.01)

(58) Field of Classification Search
CPC .......... C03C 3/097; C03C 4/18; C03C 21/00; C03C 21/002; C03C 2204/00; H05K 5/0017; H05K 5/0217
See application file for complete search history.

(56) References Cited

U.S. PATENT DOCUMENTS

| | | | |
|---|---|---|---|
| 4,055,703 A | 10/1977 | Rinehart | |
| 4,092,174 A | 5/1978 | Ellis et al. | |
| 4,298,390 A | 11/1981 | Flannery et al. | |
| 4,508,834 A | 4/1985 | Gliemeroth et al. | |
| 4,851,372 A | 7/1989 | Lindig et al. | |
| 6,297,181 B1 | 10/2001 | Kunert et al. | |
| 6,593,258 B1 | 7/2003 | Shimatani et al. | |
| 6,846,760 B2 ‡ | 1/2005 | Siebers ................... | C03C 3/085 501/32 |
| 7,091,141 B2 | 8/2006 | Horsfall et al. | |
| 8,652,979 B2 | 2/2014 | Murata | |
| 8,759,238 B2 | 6/2014 | Chapman et al. | |
| 8,765,262 B2 | 7/2014 | Gross | |
| 8,802,581 B2 | 8/2014 | Dejneka et al. | |
| 8,854,623 B2 | 10/2014 | Fontaine et al. | |
| 9,140,543 B1 | 9/2015 | Allan et al. | |
| 9,156,724 B2 | 10/2015 | Gross | |
| 9,236,075 B2 | 1/2016 | Momono et al. | |
| 9,290,413 B2 | 3/2016 | Dejneka et al. | |
| 9,346,703 B2 | 5/2016 | Bookbinder et al. | |
| 9,540,278 B2 | 1/2017 | Chapman et al. | |
| 9,556,058 B2 | 1/2017 | Dejneka et al. | |
| 9,969,644 B2 | 5/2018 | Gross et al. | |
| 9,975,803 B2 | 5/2018 | Gross | |
| 10,017,412 B2 | 7/2018 | Bookbinder et al. | |
| 10,550,029 B2 * | 2/2020 | Gross .................. | C03C 21/002 |
| 2002/0183187 A1 | 12/2002 | Siebers et al. | |
| 2003/0166446 A1 | 9/2003 | Lewis | |
| 2003/0166466 A1 | 9/2003 | Hoke et al. | |
| 2004/0092379 A1 | 5/2004 | Lewis | |
| 2004/0110623 A1 | 6/2004 | Hsu et al. | |
| 2004/0186000 A1 | 9/2004 | Kawamoto et al. | |
| 2005/0014626 A1 | 1/2005 | Doehring et al. | |
| 2005/0250639 A1 | 11/2005 | Siebers et al. | |
| 2006/0160689 A1 | 7/2006 | Hsu et al. | |

(Continued)

FOREIGN PATENT DOCUMENTS

| | | |
|---|---|---|
| CA | 2239869 A1 | 12/1998 |
| CN | 1902138 A | 1/2007 |

(Continued)

OTHER PUBLICATIONS

Bagdassarov, N., et al., "Effect of alkalis, phosphorus, and water on the surface tension of haplogranite melt", Am. Mineral., 2000, vol. 85, p. 33-40.

Dingwell, D.B., et al., "The effect of P2O5 on haplogranitic liquid", Eur. J. Mineral., 1993, vol. 5, p. 133-140.

Knoche, R., et al., "Melt densities for leucogranites and granitic pegmatites: Partial molar volumes for SiO2, Al2O3 Na2O, K2O, Li2O, Rb2O, MgO, CaO, SrO, BaO, B2O3, P2O5, F2O-1, TiO2, Nb2O3, Ta2O5, and WO3", Geochim. Cosmochim. Acta, 1995, vol. 59, No. 22, p. 4645-4652.

Shyu, Jiin-Jyh, et al., "Addition of GeO2 to Reduce the Viscosity of Parent Glasses for Low-Expansion, Transparent Glass-Ceramics Containing High-Quartz Solid Solutions", J. Am. Ceram. Soc., 2006, vol. 89, No. 10, p. 3235-3239.

Webb, S. and R. Knoche, "The glass-transition, structural relaxation and shear viscosity of silicate melts", Chem. Geol., 1996, vol. 128, No. 1-4, p. 165-183.

(Continued)

*Primary Examiner* — Elizabeth A. Bolden

(57) ABSTRACT

Glasses that undergo rapid ion exchange. The glasses comprise $SiO_2$, $Al_2O_3$, $P_2O_5$, $Na_2O$, $K_2O$, and, in some embodiments, at least one of MgO and ZnO. The glass may, for example, be ion exchanged in a molten $KNO_3$ salt bath in less than 1 hour at temperatures in a range from about 370° C. to about 390° C. to achieve a depth of surface compressive layer of greater than about 45 microns, or in a range from about 0.05t to about 0.22t, where t is the thickness of the glass. The glasses are fusion formable and, in some embodiments, compatible with zircon.

19 Claims, 2 Drawing Sheets

(56) References Cited

U.S. PATENT DOCUMENTS

| | | |
|---|---|---|
| 2006/0166806 A1 | 7/2006 | Fechner et al. |
| 2007/0135291 A1 | 6/2007 | Bernard et al. |
| 2007/0259767 A1 | 11/2007 | Siebers et al. |
| 2008/0248942 A1 | 10/2008 | Borrelli et al. |
| 2008/0268295 A1 | 10/2008 | Yagi |
| 2009/0263662 A1 | 10/2009 | Shelestak et al. |
| 2010/0119846 A1 | 5/2010 | Sawada |
| 2010/0130342 A1 | 5/2010 | Siebers et al. |
| 2011/0172077 A1 | 7/2011 | Lewis |
| 2012/0052271 A1 | 3/2012 | Gomez et al. |
| 2012/0135226 A1 | 5/2012 | Bookbinder et al. |
| 2013/0085058 A1 | 4/2013 | Nakane et al. |
| 2013/0128434 A1 | 5/2013 | Yamamoto et al. |
| 2013/0178353 A1 | 7/2013 | Comte et al. |
| 2013/0183512 A1 | 7/2013 | Gy et al. |
| 2013/0186140 A1 | 7/2013 | Brix et al. |
| 2013/0189486 A1 | 7/2013 | Wang et al. |
| 2013/0209751 A1 | 8/2013 | Zhang et al. |
| 2013/0274085 A1 | 10/2013 | Beall et al. |
| 2014/0141227 A1 | 5/2014 | Melscoet-Chauvel et al. |
| 2014/0308526 A1 | 10/2014 | Chapman et al. |
| 2014/0356608 A1 | 12/2014 | Lentes et al. |
| 2015/0004390 A1 | 1/2015 | Kawamoto et al. |
| 2015/0018194 A1 | 1/2015 | Li et al. |
| 2015/0030838 A1 | 1/2015 | Sellier et al. |
| 2015/0064472 A1 | 3/2015 | Gross et al. |
| 2015/0064473 A1 | 3/2015 | Dejneka et al. |
| 2015/0064474 A1 | 3/2015 | Dejneka et al. |
| 2015/0074974 A1 | 3/2015 | Pesansky et al. |
| 2015/0093581 A1 | 4/2015 | Murata et al. |
| 2015/0140325 A1 | 5/2015 | Gross et al. |
| 2015/0147575 A1 | 5/2015 | Dejneka et al. |
| 2015/0147576 A1 | 5/2015 | Bookbinder et al. |
| 2015/0165730 A1 | 6/2015 | Panzner et al. |
| 2015/0329413 A1 | 11/2015 | Beall et al. |
| 2015/0329418 A1 | 11/2015 | Murata et al. |
| 2015/0336843 A1 | 11/2015 | Gomez et al. |
| 2015/0353418 A1 | 12/2015 | Damm et al. |
| 2016/0009591 A1 | 1/2016 | Plevacova et al. |
| 2016/0090321 A1 | 3/2016 | Bookbinder et al. |
| 2016/0251255 A1 | 9/2016 | Gross et al. |
| 2018/0244560 A1 | 8/2018 | Gross et al. |

FOREIGN PATENT DOCUMENTS

| | | | |
|---|---|---|---|
| CN | 102167507 | A | 8/2011 |
| CN | 102730970 | A | 10/2012 |
| CN | 104114503 | A | 10/2014 |
| CN | 104211301 | A | 12/2014 |
| DE | 202009018536 | U1 | 5/2012 |
| DE | 102013103033 | A1 | 10/2013 |
| DE | 102013216736 | A1 | 2/2015 |
| EP | 1114803 | A1 | 7/2001 |
| EP | 1074518 | B1 | 3/2003 |
| EP | 909967 | B1 | 7/2006 |
| EP | 1840093 | A1 | 10/2007 |
| EP | 2075237 | A1 | 7/2009 |
| EP | 2263979 | A1 | 12/2010 |
| EP | 2351716 | A1 | 8/2011 |
| EP | 2829523 | A1 | 1/2015 |
| FR | 2357495 | A1 | 2/1978 |
| GB | 1428880 | A | 3/1976 |
| GB | 1515642 | A | 6/1978 |
| IN | 201404247 | P1 | 2/2015 |
| SU | 975620 | ‡ | 11/1982 |
| SU | 975620 | A1 | 11/1982 |
| WO | 2011149811 | A1 | 12/2011 |
| WO | 2012126394 | A1 | 9/2012 |
| WO | 2014139147 | A1 | 9/2014 |
| WO | 2015080893 | A1 | 6/2015 |
| WO | 2016049400 | A1 | 3/2016 |

OTHER PUBLICATIONS

International Search Report and Written Opinion of the International Searching Authority; PCT/US2016/067148; dated Mar. 2, 2017; 11 Pages; European Patent Office.

Schiffner, Ulrich and Wolfgang Pannhorst, "Nucleation in a Precursor for a Li2O-Al2O3-SiO2 Glass-Ceramic, Part 1. Nucleation Kinetics" Glastech. Ber., 1987, vol. 60, No. 6, p. 211-221.

"Standard Practice for Measuring Viscosity of Glass Above the Softening Point", ASTM International, Designation: C965-96, 1996.

"Standard Practices for Measurement of Liquidus Temperature of Glass by the Gradient Furnace Method", ASTM International, Designation: C829-81, 1981.

"Standard Test Method for Linear Thermal Expansion of Solid Materials With a Push-Rod Dilatometer", ASTM International, Designation: E228-11, 2011.

"Standard Test Method for Measurement of Glass Stress—Optical Coefficient", ASTM International, Designation: C770-16, 2016.

Chinese Patent Application No. 201680074559.6, Office Action dated Oct. 27, 2020, 12 pages (10 pages of English Translation and 2 pages of Original Search Report); Chinese Patent Office.

\* cited by examiner
‡ imported from a related application

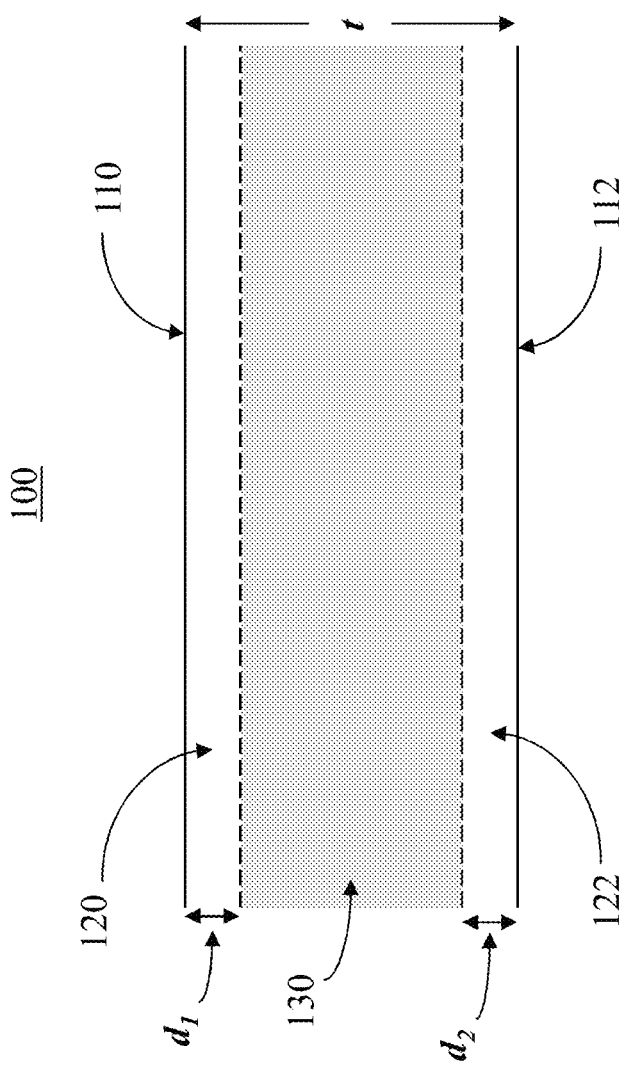

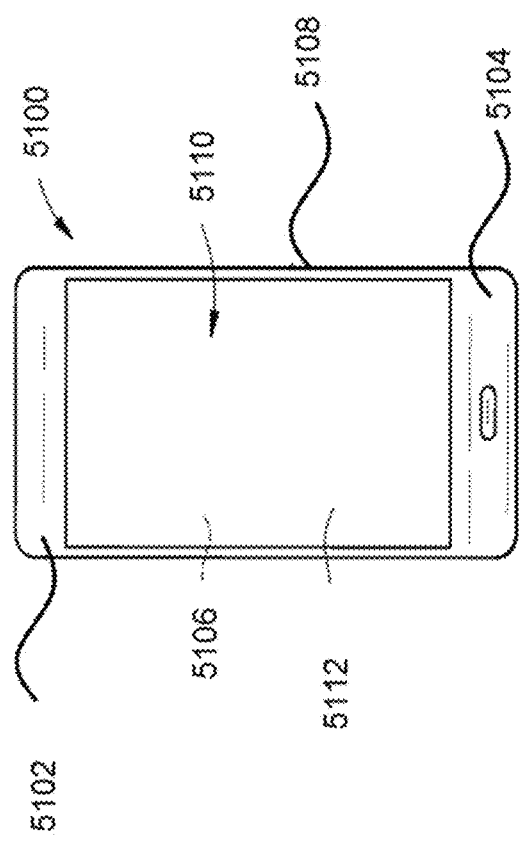
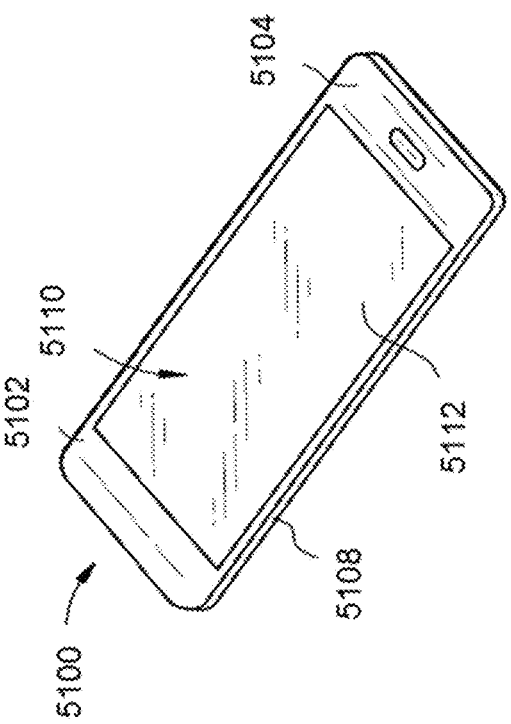

ION EXCHANGEABLE GLASS WITH FAST DIFFUSION

CROSS-REFERENCE TO RELATED APPLICATIONS

This application is a continuation of U.S. patent application Ser. No. 15/381,614 filed on Dec. 16, 2016, which claims the benefit of priority under 35 U.S.C. § 119 of U.S. Provisional Application Ser. No. 62/268,659, filed Dec. 17, 2015, the contents of which are relied upon and incorporated herein by reference in their entirety.

BACKGROUND

The disclosure relates to ion exchangeable alkali aluminosilicate glasses. More particularly, the disclosure relates to alkali aluminosilicate glasses that undergo rapid ion exchange.

It has been found that the resistance of chemically strengthened glasses to damage during drop testing (i.e., dropping the glass from a prescribed height) is affected by the depth of the surface compressive layer achieved by chemical strengthening. To date, glasses are chemically strengthened to the extent that the resulting central tension does not exceed a limit beyond which delayed failure occurs.

However, it has also been found that for some glass compositions mechanical properties increase with increasing central tension. Highly frangible glasses beak spontaneously with no delayed failure.

SUMMARY

Glasses that exhibit high diffusivity and undergo rapid ion exchange are provided. These glasses comprise comprise $SiO_2$, $Al_2O_3$, $P_2O_5$, $Na_2O$, $K_2O$, and, in some embodiments, at least one of MgO and ZnO. The glass may, for example, be ion exchanged in a molten $KNO_3$ salt bath in less than 1 hour at temperatures in a range from about 370° C. to about 390° C. to achieve a depth of surface compressive layer of greater than about 45 microns, or in a range from about 0.05t to about 0.22t, where t is the thickness of the glass. The glasses are fusion formable (i.e., the liquidus temperature is less than the 160 kP temperature) and, in some embodiments, compatible with zircon (i.e., the zircon breakdown temperature is greater than the 35 kP temperature of the glass).

Accordingly, an aspect of the disclosure is to provide a glass comprising $SiO_2$, $Al_2O_3$, $P_2O_5$, $Na_2O$, $K_2O$, and optionally at least one of MgO and ZnO, wherein ($R_2O$ (mol %)+R'O (mol %))−($Al_2O_3$ (mol %)+$P_2O_3$ (mol %))<0, where $R_2O=Li_2O+Na_2O+K_2O+Rb_2O+Cs_2O$ and $R'O=ZnO+MgO+CaO+SrO+BaO$.

Another aspect of the disclosure is to provide an ion exchanged glass comprising glass comprising $SiO_2$, $Al_2O_3$, $P_2O_5$, $Na_2O$, $K_2O$, and optionally at least one of MgO and ZnO, wherein ($R_2O$ (mol %)+R'O (mol %))−($Al_2O_3$ (mol %)+$P_2O_3$ (mol %))<0, where $R_2O=Li_2O+Na_2O+K_2O+Rb_2O+Cs_2O$ and $R'O=ZnO+MgO+CaO+SrO+BaO$.

Another aspect of the disclosure is to provide a method of ion exchanging a glass. The method comprises: ion exchanging a glass in an ion exchange bath comprising $KNO_3$ at a temperature in a range from about 370° C. to 390° C. for a period of up to one hour. The glass comprises $SiO_2$, $Al_2O_3$, $P_2O_5$, $Na_2O$, $K_2O$, and optionally at least one alkaline earth oxide and ZnO, wherein ($R_2O$ (mol %)+R'O (mol %))−($Al_2O_3$ (mol %)+$P_2O_3$ (mol %))<0, where $R_2O=Li_2O+Na_2O+K_2O+Rb_2O+Cs_2O$ and $R'O=ZnO+MgO+CaO+SrO+BaO$. The ion exchanged glass has a layer that is under a compressive stress and extends from a surface of the glass to a depth of compression of at least about 45 μm.

According to a first aspect of the disclosure, a glass is provided. The glass comprises: about 56 mol % to about 67 mol % $SiO_2$; $Al_2O_3$; about 4 mol % to about 8 mol % $P_2O_5$; $Na_2O$; greater than about 1 mol % $K_2O$; and ZnO, wherein ($R_2O$ (mol %)+R'O (mol %))−($Al_2O_3$ (mol %)+$P_2O_5$ (mol %))<0, $R_2O=Li_2O+Na_2O+K_2O+Rb_2O+Cs_2O$, and $R'O=ZnO+MgO+CaO+SrO+BaO$.

According to a second aspect of the disclosure, the glass of the first aspect is provided wherein the glass has a coefficient of thermal expansion of at least about $92 \times 10^{-7 \circ}$ $C.^{-1}$.

According to a third aspect of the disclosure, the glass of the first or second aspects is provided wherein the glass has a compressive layer extending from a surface of the glass to a depth of compression of at least about 45 μm.

According to a fourth aspect of the disclosure, the glass of the third aspect is provided wherein the depth of compression is in a range from about 45 μm up to about 200 μm.

According to a fifth aspect of the disclosure, the glass of the third or fourth aspects is provided wherein the glass has a thickness t and wherein the depth of compression is less than or equal to about 0.22t.

According to a sixth aspect of the disclosure, the glass of any of the third through fifth aspects is provided wherein the compressive layer comprises a compressive stress of at least about 500 MPa.

According to a seventh aspect of the disclosure, the glass of any of the third through sixth aspects is provided wherein the glass has been ion exchanged in an ion exchange bath comprising $KNO_3$ at a temperature in a range from about 370° C. to about 390° C. for up to one hour.

According to an eighth aspect of the disclosure, the glass of any of the first through seventh aspects is provided wherein the glass has a liquidus temperature $T^L$, a 160 kP temperature $T^{160kP}$, a 35 kP temperature $T^{35kP}$, and a zircon breakdown temperature $T^{breakdown}$, wherein $T^L < T^{160P}$ and $T^{breakdown} > T^{35kP}$.

According to a ninth aspect of the disclosure, the glass of any of the first through eighth aspects is provided wherein the glass comprises: about 57 mol % to about 67 mol % $SiO_2$; about 9 mol % to about 18 mol % $Al_2O_3$; about 13 mol % to about 16 mol % $Na_2O$; and greater than about 1 mol % to about 5 mol % $K_2O$.

According to a tenth aspect of the disclosure, the glass of any of the first through ninth aspects is provided further comprising less than about 1 mol % MgO.

According to an eleventh aspect of the disclosure, the glass of any of the first through tenth aspects is provided wherein the glass comprises greater than 60 mol % $SiO_2$.

According to a twelfth aspect of the disclosure, the glass of any of the first through eleventh aspects is provided wherein $R_2O+R'O$ is less than about 18 mol %.

According to a thirteenth aspect of the disclosure, the glass of any of the first through twelfth aspects is provided wherein the glass is substantially free of MgO.

According to a fourteenth aspect of the disclosure, the glass of any of the first through thirteenth aspects is provided wherein the glass is substantially free of at least one of $B_2O_3$ and lithium.

According to a fifteenth aspect of the disclosure, an ion exchanged glass comprising the glass of any of the first through fourteenth aspects is provided.

According to a sixteenth aspect of the disclosure, a consumer electronic product is provided, comprising: a housing having a front surface, a back surface and side surfaces; electrical components provided at least partially within the housing, the electrical components including at least a controller, a memory, and a display, the display being provided at or adjacent the front surface of the housing; and the glass of any of the first through fifteenth aspects is disposed over the display.

According to a seventeenth aspect of the disclosure, a glass is provided. The glass comprises: $SiO_2$; $Na_2O$; about 4 mol % to about 8 mol % $P_2O_5$;

about 9 mol % to about 18 mol % $Al_2O_3$; greater than about 1 mol % $K_2O$; and 0 mol % $B_2O_3$, wherein ($R_2O$ (mol %)+R'O (mol %))−($Al_2O_3$ (mol %)+$P_2O_5$ (mol %))<0, $R_2O=Li_2O+Na_2O+K_2O+Rb_2O+Cs_2O$, and R'O=ZnO+MgO+CaO+SrO+BaO.

According to an eighteenth aspect of the disclosure, the glass of the seventeenth aspect is provided wherein the glass has a coefficient of thermal expansion of at least about $92 \times 10^{-7}$ °C.$^{-1}$.

According to a nineteenth aspect of the disclosure, the glass of the seventeenth or eighteenth aspects is provided wherein the glass has a compressive layer extending from a surface of the glass to a depth of compression of at least about 45 μm.

According to a twentieth aspect of the disclosure, the glass of the nineteenth aspect is provided wherein the depth of compression is in a range from about 45 μm up to about 200 μm.

According to a twenty-first aspect of the disclosure, the glass of the nineteenth or twentieth aspects is provided wherein the glass has a thickness t and wherein the depth of compression is less than or equal to about 0.22t.

According to a twenty-second aspect of the disclosure, the glass of any of the nineteenth through twenty-first aspects is provided wherein the compressive layer comprises a compressive stress of at least about 500 MPa.

According to a twenty-third aspect of the disclosure, the glass of any of the nineteenth through twenty-second aspects is provided wherein the glass has been ion exchanged in an ion exchange bath comprising $KNO_3$ at a temperature in a range from about 370° C. to about 390° C. for up to one hour.

According to a twenty-fourth aspect of the disclosure, the glass of any of the seventeenth through twenty-third aspects is provided wherein the glass has a liquidus temperature $T^L$, a 160 kP temperature $T^{160kP}$, a 35 kP temperature $T^{35kP}$, and a zircon breakdown temperature $T^{breakdown}$, wherein $T^L < T^{160P}$ and $T^{breakdown} > T^{35kP}$.

According to a twenty-fifth aspect of the disclosure, the glass of any of the seventeenth through twenty-fourth aspects is provided wherein the glass comprises about 56 mol % to about 67 mol % $SiO_2$.

According to a twenty-sixth aspect of the disclosure, the glass of any of the seventeenth through twenty-fifth aspects is provided wherein the glass comprises about 13 mol % to about 16 mol % $Na_2O$.

According to a twenty-seventh aspect of the disclosure, the glass of any of the seventeenth through twenty-sixth aspects is provided wherein the glass comprises: about 57 mol % to about 67 mol % $SiO_2$; about 9 mol % to about 18 mol % $Al_2O_3$; about 13 mol % to about 16 mol % $Na_2O$; and greater than about 1 mol % to about 5 mol % $K_2O$.

According to a twenty-eighth aspect of the disclosure, the glass of any of the seventeenth through twenty-seventh aspects is provided further comprising less than about 1 mol % MgO.

According to a twenty-ninth aspect of the disclosure, the glass of any of the seventeenth through twenty-eighth aspects is provided wherein the glass comprises greater than 60 mol % $SiO_2$.

According to a thirtieth aspect of the disclosure, the glass of any of the seventeenth through twenty-ninth aspects is provided wherein $R_2O+R'O$ is less than about 18 mol %.

According to a thirty-first aspect of the disclosure, the glass of any of the seventeenth through thirtieth aspects is provided wherein the glass is substantially free of MgO.

According to a thirty-second aspect of the disclosure, the glass of any of the seventeenth through thirty-first aspects is provided wherein the glass is substantially free of lithium.

According to a thirty-third aspect of the disclosure, an ion exchanged glass is provided comprising the glass of any of the seventeenth through thirty-second aspects.

According to a thirty-fourth aspect of the disclosure, a consumer electronic product is provided comprising: a housing having a front surface, a back surface and side surfaces; electrical components provided at least partially within the housing, the electrical components including at least a controller, a memory, and a display, the display being provided at or adjacent the front surface of the housing; and the glass of any of the seventeenth through thirty-third aspects disposed over the display.

According to a thirty-fifth aspect of the disclosure, a method of ion exchanging a glass is provided. The method comprises: ion exchanging a glass in an ion exchange bath for a period of up to one hour to form an ion exchanged glass, wherein: the ion exchange bath comprises $KNO_3$ and is at a temperature in a range from about 370° C. to 390° C., the glass comprises: $SiO_2$, $Al_2O_3$, $P_2O_5$, $Na_2O$, and $K_2O$, wherein ($R_2O$ (mol %)+RO (mol %))−($Al_2O_3$ (mol %)+$P_2O_5$ (mol %))<0, $R_2O=Li_2O+Na_2O+K_2O+Rb_2O+Cs_2O$, and R'O=ZnO+MgO+CaO+SrO+BaO, and the ion exchanged glass comprises a layer under a compressive stress, the layer extending from a surface of the ion exchanged glass to a depth of compression of at least about 45 μm.

According to a thirty-sixth aspect of the disclosure, the method of the thirty-fifth aspect is provided wherein the depth of compression is in a range from about 45 μm up to about 200 μm.

According to a thirty-seventh aspect of the disclosure, the method of the thirty-fifth or thirty-sixth aspects is provided wherein the compressive stress is at least about 500 MPa.

According to a thirty-eighth aspect of the disclosure, the method of any of the thirty-fifth through thirty-seventh aspects is provided wherein the glass has a thickness t and wherein the depth of compression is less than or equal to about 0.22t.

According to a thirty-ninth aspect of the disclosure, the method of any of the thirty-fifth through thirty-eighth aspects is provided wherein the glass comprises: about 56 mol % to about 67 mol % $SiO_2$; about 4 mol % to about 8 mol % $P_2O_5$; $Al_2O_3$; $Na_2O$; greater than about 1 mol % $K_2O$; and ZnO.

According to a fortieth aspect of the disclosure, the method of any of the thirty-fifth through thirty-eighth aspects is provided wherein the glass comprises: $SiO_2$; $Na_2O$; about 4 mol % to about 8 mol % $P_2O_5$; about 9 mol % to about 18 mol % $Al_2O_3$; greater than about 1 mol % $K_2O$; and 0 mol % $B_2O_3$.

According to a forty-first aspect of the disclosure, the method of any of the thirty-fifth through fortieth aspects is provided wherein the glass comprises greater than 60 mol % $SiO_2$.

According to a forty-second aspect of the disclosure, the method of any of the thirty-fifth through forty-first aspects is provided wherein the glass further comprises up to about 1 mol % MgO.

According to a forty-third aspect of the disclosure, the method of any of the thirty-fifth through forty-second aspects is provided wherein $R_2O+R'O$ is less than about 18 mol %.

According to a forty-fourth aspect of the disclosure, the method of any of the thirty-fifth through forty-third aspects is provided wherein the ion exchanged glass comprises at least about 13 mol % $Al_2O_3$.

These and other aspects, advantages, and salient features of the present disclosure will become apparent from the following detailed description, the accompanying drawings, and the appended claims.

BRIEF DESCRIPTION OF THE DRAWINGS

FIG. 1 is a schematic cross-sectional view of a glass sheet that has been ion exchanged.

FIG. 2A is a plan view of an exemplary electronic device incorporating any of the glasses disclosed herein.

FIG. 2B is a perspective view of the exemplary electronic device of FIG. 2A.

DETAILED DESCRIPTION

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass article" and "glass articles" are used in their broadest sense to include any object made wholly or partly of glass. Unless otherwise specified, all compositions are expressed in terms of mole percent (mol %). Coefficients of thermal expansion (CTE) are expressed in terms of $10^{-7}/°$ C. and represent a value measured over a temperature range from about 20° C. to about 300° C. using a push-rod dilatometer in accordance with ASTM E228-11, unless otherwise specified.

As used herein, the term "liquidus temperature," or "$T^L$" refers to the temperature at which crystals first appear as a molten glass cools down from the melting temperature, or the temperature at which the very last crystals melt away as temperature is increased from room temperature. The liquidus temperature of the glass is measured in accordance with ASTM C829-81 (2015), titled "Standard Practice for Measurement of Liquidus Temperature of Glass by the Gradient Furnace Method". As used herein, the term "160 kP temperature" or "$T^{160kP}$" refers to the temperature at which the glass or glass melt has a viscosity of 160,000 Poise (P), or 160 kiloPoise (kP). As used herein, the term "35 kP temperature" or "$T^{35kP}$" refers to the temperature at which the glass or glass melt has a viscosity of 35,000 Poise (P), or 35 kiloPoise (kP). The $T^{160kP}$ and $T^{35kP}$ may be determined in accordance with ASTM C965-96(2012), titled "Standard Practice for Measuring Viscosity of Glass Above the Softening Point".

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, a glass that is "substantially free of MgO," for example, is one in which MgO is not actively added or batched into the glass, but may be present in very small amounts (e.g., ≤0.01 mol %) as a contaminant.

Compressive stress and depth of compression (DOC) are measured using those means known in the art. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

As used herein, DOC means the depth at which the stress in the chemically strengthened alkali aluminosilicate glass article described herein changes from compressive to tensile. DOC may be measured by FSM or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

The stress profiles may also be determined from the spectra of bound optical modes for TM and TE polarization by using the inverse Wentzel-Kramers-Brillouin (IWKB) method as taught in U.S. Pat. No. 9,140,543, the contents of which are hereby incorporated by reference in its entirety.

Referring to the drawings in general and to FIG. 1 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

Described herein is an ion exchangeable glass that is capable of undergoing ion exchange of $K^+$ ions for $Na^+$ ions at a rate that is greater than that of similar glasses. These glasses comprise $P_2O_5$ and $K_2O$ and have very high diffusion rates at ion exchange temperatures. The high rate of $K^+$ diffusivity and $K^+$ for $Na^+$ ion exchange enables deep depths of compression (DOC) to be achieved with less stress relaxation occurring during the ion exchange.

The glasses described herein may comprise $SiO_2$, $Al_2O_3$, $P_2O_5$, $Na_2O$, $K_2O$, and optionally ZnO and/or at least one alkaline earth oxide R'O, where $(R_2O \text{ (mol \%)}+R'O \text{ (mol \%)})-(Al_2O_3 \text{ (mol \%)}+P_2O_3 \text{ (mol \%)})<0$, where $R_2O=Li_2O+Na_2O+K_2O+Rb_2O+Cs_2O$ and $R'O=ZnO+MgO+CaO+SrO+BaO$. In some embodiments, the glass consists essentially of or comprises from about 56 mol % to about 67 mol % $SiO_2$ (i.e., 56 mol %≤$SiO_2$≤67 mol %); from about 9 mol % to about 18 mol % $Al_2O_3$ (i.e., 9 mol %≤$Al_2O_3$≤18 mol %); from about 4 mol % to about 8 mol % $P_2O_5$ (i.e., 4 mol %≤$P_2O_5$≤8 mol %); from about 13 mol % to about 16 mol % $Na_2O$ (i.e., 13 mol %≤$Na_2O$≤16 mol %); and greater than about 1 mol % to about 5 mol % $K_2O$ (i.e., 1 mol %≤$K_2O$≤5 mol %). In certain embodiments, the glass consists essentially of or comprises from about 60 mol % to about 65 mol % $SiO_2$ (i.e., 60 mol %≤$SiO_2$≤65 mol %); from about 10 mol % to about 15 mol % $Al_2O_3$ (i.e., 10 mol %≤$Al_2O_3$≤15 mol %); from about 4 mol % to about 7 mol % $P_2O_5$ (i.e., 4 mol %≤$P_2O_5$≤7 mol %); from about 13 mol % to about 16 mol % $Na_2O$ (i.e., 13 mol %≤$Na_2O$≤16 mol %); and greater than about 1 mol % to about 5 mol % $K_2O$ (i.e., 1 mol %≤$K_2O$≤5 mol %).

In some embodiments, the glass is substantially free of MgO. In some embodiments, the glass is substantially free of at least one of $B_2O_3$, lithium, $Li_2O$. Compositions, strain points, anneal points, and softening points of non-limiting examples of these glasses are listed in Table 1.

Silica ($SiO_2$) is the primary network former in the glasses described herein. In some embodiments, these glasses comprise from about 56 mol % to about 67 mol % $SiO_2$. In certain embodiments, the glasses comprise from about 58 mol % or about 60 mol % to about 65 mol % $SiO_2$.

Alumina ($Al_2O_3$) primarily facilitates ion exchange. In addition, $Al_2O_3$ suppresses phase separation. In some embodiments, the glasses described herein include from about 9 mol % to about 18 mol % $Al_2O_3$. In other embodiments, these glasses comprise 10 mol % to about 17 mol % $Al_2O_3$.

The presence of the alkali metal oxides $Na_2O$ and $K_2O$ increases the CTE of the glass. $K_2O$ is also very effective in increasing the $Na^+$ to $K^+$ diffusion between the glass and the molten salt ion exchange bath and plays a primary role in increasing CTE, followed by $Na_2O$. However, the presence of $K_2O$ tends to lower compressive stress when the glass is ion exchanged and lowers the temperature at which zircon breaks down ($T^{breakdown}$) in the presence of the glass melt. The glasses described herein, in some embodiments, comprise greater than about 1 mol % $K_2O$. In some embodiments, the glass comprises greater than about 1 mol % to about 5 mol % $K_2O$ and, in other embodiments, from about 2 mol % to about 5 mol % $K_2O$. The presence of $Na_2O$ in the glass enhances the ion exchangeability of the glass. In some embodiments, the glass comprises from about 13 mol % to about 16 mol % $Na_2O$. The glass may, in some embodiments, further comprise other alkali metal oxides ($Li_2O$, $Rb_2O$, $Cs_2O$), but these oxides either inhibit ion exchange, result in lower surface compressive stress in the ion exchange glass, or are relatively expensive. In some embodiments, the glass comprises less than about 1.5 mol % $Li_2O$, and, in certain embodiments, is free of or substantially free of $Li_2O$.

Zinc oxide and the alkaline earth oxide MgO increase the surface compressive stress in the ion exchanged glass. However, MgO tends to reduce the coefficient of thermal expansion of the glass. In some embodiments, the glasses described herein comprise up to about 1 mol % MgO and ZnO (i.e., MgO+ZnO≤1 mol %), or up to about 0.1 mol % MgO and ZnO (i.e., MgO+ZnO≤0.1 mol %), or up to about 0.01 mol % MgO and ZnO (i.e., MgO+ZnO≤0.01 mol %). In certain embodiments, the glass is free or substantially free of MgO and/or ZnO. CaO tends to inhibit ion exchange and decreases the CTE of the glass. Accordingly, the glass may be free of CaO as well as SrO and BaO.

The glasses described herein are characterized by $(R_2O \text{ (mol \%)}+R'O \text{ (mol \%)})-(Al_2O_3 \text{ (mol \%)}+P_2O_3 \text{ (mol \%)})<0$, where $R_2O=Li_2O+Na_2O+K_2O+Rb_2O+Cs_2O$ and $R'O=ZnO+MgO+CaO+SrO+BaO$. This relationship contributes, at least in part, to the ability of the glasses to undergo rapid ion exchange. In some embodiments, the total amount of alkali metal oxides ($R_2O$) and ZnO and alkaline earth oxides (R'O) in the glasses described herein is less than about 18 mol % (i.e., $R_2O+R'O<18$ mol %).

The presence of $P_2O_5$ in the glass promotes ion exchange of the glass by increasing the diffusivity of certain cations such as, for example, $K^+$. In addition, $P_2O_5$ tends to increase the temperature at which zircon breaks down ($T^{breakdown}$) in the presence of the glass melt. In some embodiments, the glasses described herein comprise from about 4 mol % to about 8 mol % $P_2O_5$ and, in certain embodiments, from about 4 mol % to about 7 mol % $P_2O_5$.

The glasses described herein have coefficients of thermal expansion (CTE) of at least about $92 \times 10^{-7}$ °C.$^{-1}$. In other embodiments, the CTE is at least about $94 \times 10^{-7}$ °C.$^{-1}$ and in still other embodiments, at least about $96 \times 10^{-7}$ °C.$^{-1}$. In certain embodiments, the CTE is in a range from about $92 \times 10^{-7}$ °C.$^{-1}$ up to about $102 \times 10^{-7}$ °C.$^{-1}$, and, in other embodiments, from about $92 \times 10^{-7}$ °C.$^{-1}$ up to about $100 \times 10^{-7}$ °C.$^{-1}$. Table 1 lists coefficients of thermal expansion for non-limiting examples of the glasses described herein.

The glasses described herein are fusion formable; i.e., the glasses have liquidus temperatures $T^L$ that allow them to be formed by the fusion draw method or by other down-draw methods known in the art. In order to be fusion formable, the liquidus temperature of a glass should be less than the 160 kP temperature $T^{160kP}$ of the glass (i.e., $T^L < T^{160kP}$).

The hardware used in the fusion draw process, such as an isopipe, is often made from zircon. If the temperature at which the zircon in the isopipe breaks down to form zirconia and silica (also referred to herein as the "breakdown temperature" or "$T^{breakdown}$,") is less than any temperature "seen" or experienced on the isopipe, the zircon will break down to form silica and zirconia. As a result, the glass formed by the fusion process will contain zirconia inclusions (also referred to as "fusion line zirconia"). It is therefore desirable to form the glass at temperatures that are too low to decompose zircon and create zirconia, and thus prevent the formation of zirconia defects in the glass. Alternatively, the isopipe may be made of other refractory materials, such as alumina, thus eliminating the breakdown of zircon as a factor in the fusion draw process.

Because fusion is essentially an isoviscous process, the highest temperature seen by the glass corresponds to a particular viscosity of the glass. In those standard fusion-draw operations known in the art, this viscosity is about 35 kP, and the temperature at which this viscosity is attained is referred to as the 35 kP temperature, or $T^{35kP}$. Table 2 lists density, $T^L$, $T^{160kP}$, $T^{35kP}$, and $T^{breakdown}$ for selected examples listed in Table 1.

In some embodiments, the glasses described herein are ion exchanged using those means known in the art. In one non-limiting example, the glass is immersed in a molten salt bath containing an alkali metal cation such as, for example, K$^+$, which is larger than the Na$^+$ cation present in the glass. Means other than immersion in a molten salt bath may be used to ion exchange of the glass. Such means include, but are not limited to, the application of a paste or gel containing the cation to be introduced into the glass to at least one surface of the glass.

The ion exchanged glass has at least one surface layer that is under a compressive stress (CS), as schematically shown in FIG. 1. Glass 100 has a thickness t, first surface 110, and second surface 112. Glass 100, in some embodiments, has a thickness t of up to about 2 mm, and all ranges and subranges therebetween, for example from about 0.1 mm to about 2 mm, up to about 1 mm, up to 0.7 mm, or up to about 0.5 mm. Glass 100 has a first layer 120 under a compressive stress ("compressive layer") extending from first surface 110 to a depth of compression $d_1$ into the bulk of the glass article 100. In the embodiment shown in FIG. 1, glass 100 also has a second compressive layer 122 under compressive stress extending from second surface 112 to a second depth of compression $d_2$. Glass 100 also has a central region 130 that extends from $d_1$ to $d_2$. Central region 130 is under a tensile stress or central tension, which balances or counteracts the compressive stresses of layers 120 and 122. The depths of compression $d_1$, $d_2$ of first and second compressive layers 120, 122 protect the glass 100 from the propagation of flaws introduced by sharp impact to first and second surfaces 110, 112 of glass 100, while the magnitude of the compressive stress in first and second compressive layers 120, 122 minimizes the likelihood of a flaw penetrating through the depth $d_1$, $d_2$ of first and second compressive layers 120, 122.

In some embodiments, the ion exchanged glass described herein has a compressive layer extending from a surface of the glass to a depth of compression of at least about 45 µm, and all ranges and subranges therebetween, for example in certain embodiments, the depth of compression is in a range from about 45 µm up to about 200 µm. The depth of compression, in some embodiments, is in a range from about 0.05t to about 0.22t and, in some embodiments, up to about 0.20t, where t is the thickness expressed in microns (µm). The compressive stress in some embodiments, has a maximum compressive stress at the surface. The compressive layer(s) of the glass, in some embodiments, are under a maximum compressive stress of at least about 500 MPa. In some embodiments, the maximum compressive stress is at least about 700 MPa, and, in other embodiments, at least about 800 MPa when the glass is ion exchanged to a depth of compression of at least about 45 µm. Table 3a lists surface compressive stresses (CS) and depths of compression (DOC), determined from surface stress (FSM) measurements, for examples 1-6 in Table 1 and two reference/control samples that were ion exchanged for 1 hour in a molten KNO$_3$ (100% KNO$_3$ by weight) bath at 410° C. Table 3b lists surface compressive stresses (CS) and depths of compression (DOC), determined from surface stress (FSM) measurements, for examples 7-12 listed in Table 1 that were ion exchanged at various times and temperatures in a molten KNO$_3$ (100% KNO$_3$ by weight). Table 3c lists surface compressive stresses (CS) and Depths of Compression (DOC) determined for examples 13-18 listed in Table 1. The examples in Table 3c were ion exchanged at 430° C. for 8 hours in a molten ion exchange bath comprising 100% KNO$_3$ by weight. The compressive stress (CS) and DOC were determined from spectra of bound optical modes for TM and TE polarization collected via prism coupling techniques. Using the inverse Wentzel-Kramers-Brillouin (IWKB) method detailed and precise TM and TE refractive index profiles $n_{TM}(z)$ and $n_{TE}(Z)$ were obtained from the spectra.

In another aspect, a method of ion exchanging a glass is also provided. The method includes ion exchanging a glass, which comprises SiO$_2$, Al$_2$O$_3$, P$_2$O$_5$, Na$_2$O, and optionally at least one of ZnO and at least one alkaline earth oxide, wherein (R$_2$O (mol %)+RO (mol %))−(Al$_2$O$_3$ (mol %)+P$_2$O$_5$ (mol %))<0, where R$_2$O=Li$_2$O+Na$_2$O+K$_2$O+Rb$_2$O+Cs$_2$O and R'O=MgO+CaO+SrO+BaO, in an ion exchange bath comprising a potassium salt such as, but not limited to, KNO$_3$ at a temperature in a range from about 370° C. to 390° C. for a period of up to one hour to form a compressive layer extending from a surface of the glass to a depth of compression of at least about 45 µm. In certain embodiments, the depth of compression is in a range from about 45 µm up to about 200 µm and, in other embodiments, up to about 300 µm. The depth of compression, in some embodiments, is in a range from about 0.05t to about 0.22t and, in some embodiments, up to about 0.20t, where t is the thickness expressed in microns (µm). The ion exchange bath may contain other salts, such as, for example, NaNO$_3$, or may contain only, or consist essentially of, KNO$_3$. The ion exchange bath is maintained at a temperature in a range from about 370° C. to 390° C. throughout the process. The compressive layer(s) of the glass, in some embodiments, include a compressive stress of at least about 500 MPa. In some embodiments, the maximum compressive stress is at least about 700 MPa, and, in other embodiments, at least about 800 MPa.

In some embodiments, the glass may be ion exchanged using a two-step or dual ion exchange (DIOX) process in which the glass is immersed in a first ion exchange bath followed by immersion in a second ion exchange bath, wherein the composition of the first ion exchange bath differs from that of the second ion exchange bath. In addition, the temperatures and immersion times in the first and second ion exchange baths may differ from each other. The DIOX process may be used to achieve a deep depth of compression and provide an increased maximum compressive stress or compressive stress "spike" at the surface. In one non-limiting example, the glass is ion exchanged at 450° C. for about 20 hours in a first bath containing about 30% $NaNO_3$ and about 70% $KNO_3$ by weight and then ion exchanged at about 360° C. for about 12 minutes in a second bath containing about 5% $NaNO_3$ and about 95% $KNO_3$ by weight.

TABLE 1

Compositions, strain points, anneal points, softening points, and coefficients of thermal expansion of glasses.

| | Example | | | | | |
|---|---|---|---|---|---|---|
| | 1 | 2 | 3 | 4 | 5 | 6 |
| $SiO_2$ | 60.69 | 60.77 | 60.81 | 57.58 | 57.69 | 57.52 |
| $Al_2O_3$ | 13.96 | 14.01 | 14.05 | 16.98 | 16.96 | 16.97 |
| $P_2O_5$ | 7.72 | 7.64 | 7.60 | 7.75 | 7.70 | 7.81 |
| $Na_2O$ | 15.55 | 14.57 | 13.58 | 15.60 | 14.63 | 13.69 |
| $K_2O$ | 1.92 | 2.87 | 3.81 | 1.93 | 2.89 | 3.85 |
| MgO | | | | | | |
| $SnO_2$ | | | | | | |
| $(P_2O_5 + R_2O)/Al_2O_3$ | 1.804 | 1.790 | 1.780 | 1.489 | 1.487 | 1.494 |
| CTE (0-300° C.) | 92 | 94.1 | 94.3 | 91.3 | 92.3 | 93.2 |
| Strain Point (° C.) | 553 | 545 | 548 | 590 | 586 | 588 |
| Anneal Point (° C.) | 610 | 601 | 605 | 650 | 646 | 648 |
| Softening Point (° C.) | 893.9 | 902.2 | 899.2 | 940.1 | 944.6 | 948.1 |

| | Example | | | | | |
|---|---|---|---|---|---|---|
| | 7 | 8 | 9 | 10 | 11 | 12 |
| $SiO_2$ | 62.97 | 65.07 | 64.95 | 62.81 | 62.93 | 63.00 |
| $Al_2O_3$ | 12.06 | 10.06 | 11.10 | 13.08 | 12.09 | 11.08 |
| $P_2O_5$ | 7.48 | 7.44 | 6.48 | 6.55 | 6.49 | 7.49 |
| $Na_2O$ | 13.62 | 13.57 | 13.58 | 13.63 | 14.60 | 14.58 |
| $K_2O$ | 3.80 | 3.78 | 3.82 | 3.84 | 3.82 | 3.77 |
| MgO | 0.01 | 0.01 | 0.01 | 0.02 | 0.02 | 0.01 |
| $SnO_2$ | 0.03 | 0.03 | 0.03 | 0.03 | 0.03 | 0.03 |
| $(P_2O_5 + R_2O)/Al_2O_3$ | 2.064 | 2.465 | 2.151 | 1.837 | 2.060 | 2.332 |
| CTE (0-300° C.) | 95 | 98 | 95.7 | 94.2 | 98.9 | 100.5 |
| Strain Point (° C.) | 527 | 589 | 550 | 544 | 536 | 546 |
| Anneal Point (° C.) | 580 | 642 | 599 | 600 | 584 | 593 |
| Softening Point (° C.) | 877.2 | 934.1 | 893.8 | 898.1 | 868.8 | 896.1 |

| | Example | | | | |
|---|---|---|---|---|---|
| | 13 | 14 | 15 | 16 | 17 |
| $SiO_2$ | 63.61 | 62.60 | 62.68 | 62.61 | 62.56 |
| $Al_2O_3$ | 12.91 | 13.89 | 12.96 | 12.93 | 13.94 |
| $P_2O_5$ | 5.87 | 5.88 | 5.81 | 5.88 | 5.86 |
| $Na_2O$ | 13.69 | 13.69 | 14.65 | 13.70 | 14.68 |
| $K_2O$ | 3.87 | 3.89 | 3.86 | 3.89 | 2.92 |
| MgO | 0.01 | 0.01 | 0.01 | 0.96 | 0.01 |
| $SnO_2$ | 0.03 | 0.03 | 0.03 | 0.03 | 0.03 |
| $(P_2O_5 + R_2O)/Al_2O_3$ | 1.814 | 1.689 | 1.877 | 1.816 | 1.683 |
| CTE (0-300° C.) | 94.6 | 94.1 | 98 | 94.9 | 92.9 |
| Strain Point (° C.) | | | 537 | | 559 |
| Anneal Point (° C.) | | | 588 | | 615 |
| Softening Point (° C.) | 896.7 | 918.3 | | | 906 |

| | Example 18 | Reference glass A |
|---|---|---|
| $SiO_2$ | 62.67 | 58.18 |
| $Al_2O_3$ | 13.94 | 15.32 |
| $P_2O_5$ | 4.83 | 6.55 |
| $Na_2O$ | 14.65 | 16.51 |
| $K_2O$ | 3.87 | 2.28 |
| MgO | 0.01 | 1.07 |
| $SnO_2$ | 0.03 | 0.10 |
| $(P_2O_5 + R_2O)/Al_2O_3$ | 1.674 | 58.18 |
| CTE (0-300° C.) | 97.4 | 97.3 |

TABLE 1-continued

Compositions, strain points, anneal points, softening points, and coefficients of thermal expansion of glasses.

| | | |
|---|---|---|
| Strain Point (° C.) | 561 | 556 |
| Anneal Point (° C.) | 615 | 609 |
| Softening Point (° C.) | 897.4 | 884 |

TABLE 2

Physical properties, including densities, 35 kP temperatures, 160 kP temperatures, zircon breakdown temperatures $T^{breakdown}$, zircon breakdown viscosities, liquidus temperatures and viscosities, refractive indices (RI), Poisson's ratios, shear moduli, Young's moduli, and stress optical coefficients (SOC) for glasses listed in Table 1.

| | Example | | | | | |
|---|---|---|---|---|---|---|
| | 1 | 2 | 3 | 4 | 5 | 6 |
| 35 kP Temp $T^{35\ kP}$ (° C.) | 1219 | 1229 | 1226 | 1248 | 1262 | 1270 |
| 160 kP Temp $T^{160\ kP}$ (° C.) | 1126 | 1134 | 1133 | 1159 | 1172 | 1179 |
| Zircon Breakdown Temp (° C.) | | | | | | |
| Zircon Breakdown Viscosity (kP) | | | | | | |
| Liquidus Temp (° C.) | | | | | | |
| Liquidus Viscosity (×10$^6$ P) | | | | | | |
| Density (RT) | 2.399 | 2.399 | 2.399 | 2.406 | 2.406 | 2.405 |
| RI | 1.4866 | 1.4865 | 1.4865 | 1.4889 | 1.4889 | 1.4889 |
| Poissons Ratio | 0.21 | 0.216 | 0.212 | 0.212 | 0.219 | 0.201 |
| Shear Modulus (Mpsi) | 3.71 | 3.72 | 3.71 | 3.79 | 3.8 | 3.8 |
| Youngs Modulus (Mpsi) | 8.98 | 9.06 | 9 | 9.2 | 9.27 | 9.13 |

| | Example | | | | | |
|---|---|---|---|---|---|---|
| | 7 | 8 | 9 | 10 | 11 | 12 |
| 35 kP Temp $T^{35\ kP}$ (° C.) | | 1168 | 1184 | 1220 | | 1170 |
| 160 kP Temp $T^{160\ kP}$ (° C.) | | 1082 | 1092 | 1124 | | 1080 |
| Zircon Breakdown Temp (° C.) | | >1277 | >1278 | >1308 | | |
| Zircon Breakdown Viscosity (kP) | | | | | | |
| Liquidus Temp (° C.) | | 1040 | 925 | 895 | | |
| Liquidus Viscosity (×10$^6$ P) | | | | | | |
| Density (RT) | 2.393 | 2.397 | 2.39 | 2.4 | 2.402 | 2.394 |
| SOC (nm/mm/Mpa) | 3.011 | 3.098 | 3.029 | 3.037 | 2.996 | 3.038 |
| RI | 1.4846 | 1.4815 | 1.4844 | 1.4872 | 1.4866 | 1.4839 |
| Poissons Ratio | 0.211 | 0.208 | 0.21 | 0.208 | 0.211 | 0.209 |
| Shear Modulus (Mpsi) | 3.68 | 3.63 | 3.71 | 3.75 | 3.72 | 3.64 |
| Youngs Modulus (Mpsi) | 8.9 | 8.77 | 8.97 | 9.05 | 9 | 8.8 |

| | Example | | | | |
|---|---|---|---|---|---|
| | 13 | 14 | 15 | 16 | 17 |
| 35 kP Temp $T^{35\ kP}$ (° C.) | 1233 | 1252 | 1204 | 1227 | 1246 |
| 160 kP Temp $T^{160\ kP}$ (° C.) | 1140 | 1157 | 1110 | 1132 | 1151 |
| Zircon Breakdown Temp (° C.) | | | | | |
| Zircon Breakdown Viscosity (kP) | | | | | |
| Liquidus Temp (° C.) | | | | | |
| Liquidus Viscosity (×10$^6$ P) | | | | | |
| Density (RT) | 2.404 | 2.407 | 2.411 | 2.41 | 2.407 |
| SOC (nm/mm/Mpa) | 3.032 | 3.062 | 3.016 | 3.009 | 3.091 |
| RI | 1.4882 | 1.4890 | 1.4891 | 1.4892 | 1.4892 |
| Poissons Ratio | 0.21 | 0.21 | 0.21225 | 0.2093 | 0.21 |
| Shear Modulus (Mpsi) | 3.80 | 3.83 | 3.7975 | 3.8567 | 3.83 |
| Youngs Modulus (Mpsi) | 9.20 | 9.26 | 9.205 | 9.32 | 9.27 |

| | Example 18 | Reference glass A |
|---|---|---|
| 35 kP Temp $T^{35\ kP}$ (° C.) | 1231 | 1203 |
| 160 kP Temp $T^{160\ kP}$ (° C.) | 1135 | 1115 |
| Zircon Breakdown Temp (° C.) | | 1210 |
| Zircon Breakdown Viscosity (kP) | | 31.31 |
| Liquidus Temp (° C.) | | 780 |
| Liquidus Viscosity (×10$^6$ P) | | 2464.31 |
| Density (RT) | 2.42 | 2.422 |
| SOC (nm/mm/Mpa) | 3.01 | 2.95 |
| RI | 1.4915 | 1.4913 |
| Poissons Ratio | 0.214 | 0.205 |

TABLE 2-continued

Physical properties, including densities, 35 kP temperatures, 160 kP temperatures, zircon breakdown temperatures $T^{breakdown}$, zircon breakdown viscosities, liquidus temperatures and viscosities, refractive indices (RI), Poisson's ratios, shear moduli, Young's moduli, and stress optical coefficients (SOC) for glasses listed in Table 1.

| | | |
|---|---|---|
| Shear Modulus (Mpsi) | 3.8775 | 3.845 |
| Youngs Modulus (Mpsi) | 9.4075 | 9.266 |

TABLE 3a

Surface compressive stresses (CS) and depths of compression (DOC), determined from surface stress (FSM) measurements, for examples 1-6 listed in Table 1 and two reference/control samples (reference sample A composition is given in Table 1; reference sample B composition is 57 mol % $SiO_2$, 0 mol % $B_2O_3$, 17 mol % $Al_2O_3$, 7 mol % $P_2O_5$, 17 mol % $Na_2O$, 0.02 mol % $K_2O$, and 3 mol % MgO) that were ion exchanged for 1 hour in a molten $KNO_3$ (100% $KNO_3$ by weight) bath at 410° C.

| | Example | | | | | |
|---|---|---|---|---|---|---|
| | 1 | 2 | 3 | 4 | 5 | 6 |
| | 410° C. 1 h | | | | | |
| CS (MPa) | 677 | 647 | 602 | 794 | 766 | 700 |
| DOL (μm) | 56 | 62 | 64 | 51 | 52 | 54 |

| | Control | |
|---|---|---|
| | B | A |
| CS (MPa) | 945 | 823 |
| DOC (μm) | 26 | 42 |

TABLE 3b

Surface compressive stresses (CS) and depths of compression (DOC), determined from surface stress (FSM) measurements, for examples 7-12 listed in Table 1 that were ion exchanged at various times and temperatures in a molten $KNO_3$ (100% $KNO_3$ by weight).

| | Example | | | | | |
|---|---|---|---|---|---|---|
| | 7 | 8 | 9 | 10 | 11 | 12 |
| | 390° C. 1 h | | | | | |
| CS (MPa) | 788 | 726 | 808 | 877 | 880 | 801 |
| DOC (μm) | 51 | 45 | 45 | 53 | 48 | 46 |
| | 390° C. 2 h | | | | | |
| CS (MPa) | 768 | 726 | 808 | 853 | 864 | 795 |
| DOC (μm) | 70 | 59 | 61 | 73 | 66 | 62 |
| | 430° C. 2 h | | | | | |
| CS (MPa) | 705 | 685 | 759 | 794 | 788 | 727 |
| DOC (μm) | 110 | 86 | 89 | 105 | 102 | 92 |
| | 430° C. 1 h | | | | | |
| CS (MPa) | 502 | 712 | 783 | 560 | 563 | 522 |
| DOC (μm) | 78 | 63 | 69 | 83 | 77 | 73 |

TABLE 3c

Surface compressive stresses (CS) and depths of compresion (DOC), from spectra of bound optical modes for TM and TE polarization collected via prism coupling techniques and the inverse Wentzel-Kramers-Brillouin (IWKB) method, for examples 13-18 listed in Table 1 that were ion exchanged at 430° C. for 8 hours in a molten $KNO_3$ (100% $KNO_3$ by weight) ion exchange bath.

| | Example | | | | | |
|---|---|---|---|---|---|---|
| | 13 | 14 | 15 | 16 | 17 | 18 |
| | 430° C. 8 h | | | | | |
| CS (MPa) | 373 | 449 | 403 | 463 | 493 | 480 |
| DOC (μm) | 191 | 211 | 243 | 226 | 213 | 229 |

The glasses disclosed herein may be incorporated into another article, such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the glasses disclosed herein is shown in FIGS. 2A and 2B. Specifically, FIGS. 2A and 2B show a consumer electronic device 5100 including a housing 5102 having front 5104, back 5106, and side surfaces 5108; electrical components (not shown) that are at least partially inside or entirely within the housing and including at least a controller, a memory, and a display 5110 at or adjacent to the front surface of the housing; and a cover substrate 5112 at or over the front surface of the housing such that it is over the display. In some embodiments, the cover substrate 5112 may include any of the glasses disclosed herein.

While typical embodiments have been set forth for the purpose of illustration, the foregoing description should not be deemed to be a limitation on the scope of the disclosure or appended claims. Accordingly, various modifications, adaptations, and alternatives may occur to one skilled in the art without departing from the spirit and scope of the present disclosure and appended claims.

The invention claimed is:

1. A glass comprising:
   from greater than 57 mol % to 67 mol % $SiO_2$;
   from 9 mol % to 18 mol % $Al_2O_3$;
   from 4 mol % to 8 mol % $P_2O_5$;
   from 13 mol % to 16 mol % $Na_2O$;
   from greater than 1 mol % to 5 mol % $K_2O$; and
   ZnO,
   wherein $(R_2O(mol \%)+R'O(mol \%))-(Al_2O_3(mol \%)+P_2O_5(mol \%))<0$, $R_2O=Li_2O+Na_2O+K_2O+Rb_2O+Cs_2O$, and $R'O=ZnO+MgO+CaO+SrO+BaO$, and
   wherein the glass is substantially free of lithium.

2. The glass of claim 1, wherein the glass comprises greater than 60 mol % $SiO_2$.

3. The glass of claim 1, wherein the glass comprises from 60 mol % to 65 mol % $SiO_2$.

4. The glass of claim 1, wherein the glass comprises:
greater than 57 mol % to 67 mol % $SiO_2$;
9 mol % to 18 mol % $Al_2O_3$;
13 mol % to 16 mol % $Na_2O$; and
greater than 0 mol % to less than 1 mol % MgO+ZnO, wherein $R_2O+R'O$ is less than 18 mol %.

5. The glass of claim 1, wherein the glass comprises from 10 mol % to 15 mol % $Al_2O_3$.

6. The glass of claim 1, wherein the glass comprises from 4 mol % to 7 mol % $P_2O_5$.

7. The glass of claim 1, wherein the glass comprises from greater than 0 mol % to less than 0.1 mol % MgO+ZnO.

8. The glass of claim 1, wherein the glass is substantially free of MgO.

9. The glass of claim 1, wherein $R_2O+R'O$ is less than 18 mol %.

10. The glass of claim 1, wherein the glass is substantially free of $B_2O_3$.

11. The glass of claim 1, wherein the glass has a coefficient of thermal expansion of at least $92 \times 10^{-7}$ $C.^{-1}$.

12. The glass of claim 1, wherein the glass has a liquidus temperature $T^L$, a 160kP temperature $T^{160kP}$, a 35 kP temperature $T^{35kP}$, and a zircon breakdown temperature $T^{breakdown}$, wherein $T^L < T^{160P}$ and $T^{breakdown} > T^{35kP}$.

13. The glass of claim 1, wherein the glass has a compressive layer extending from a surface of the glass to a depth of compression of at least 45 μm.

14. The glass of claim 13, wherein the depth of compression is in a range from 45 μm up to 200 μm.

15. The glass of claim 13, wherein the glass has a thickness t and wherein the depth of compression is less than or equal to 0.22t.

16. The glass of claim 13, wherein the compressive layer comprises a compressive stress of at least 500 MPa.

17. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
the glass of claim 1 disposed over the display.

18. An ion exchanged glass comprising the glass of claim 1.

19. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
the glass of claim 18 disposed over the display.

* * * * *

UNITED STATES PATENT AND TRADEMARK OFFICE
CERTIFICATE OF CORRECTION

PATENT NO. : 11,932,577 B2
APPLICATION NO. : 16/780369
DATED : March 19, 2024
INVENTOR(S) : Timothy Michael Gross et al.

Page 1 of 1

It is certified that error appears in the above-identified patent and that said Letters Patent is hereby corrected as shown below:

On the Title Page

In item (56), in Column 2, under "Other Publications", Line 4, delete "P205" and insert -- $P_2O_5$ --.

In item (56), in Column 2, under "Other Publications", Line 9, delete "Nb2O3" and insert -- $Nb_2O_5$ --.

In the Claims

In Column 16, Line 64, in Claim 1, delete "P′O=" and insert -- R′O= --.

In Column 17, Line 26, in Claim 12, delete "$T^L<T^{160P}$" and insert -- $T^L<T^{160kP}$ --.

Signed and Sealed this
Twenty-second Day of October, 2024

Katherine Kelly Vidal
*Director of the United States Patent and Trademark Office*